US006749775B2

(12) United States Patent
Bloom

(10) Patent No.: US 6,749,775 B2
(45) Date of Patent: Jun. 15, 2004

(54) CONDUCTIVE VIA COMPOSITION

(75) Inventor: Terry R. Bloom, Middlebury, IN (US)

(73) Assignee: CTS Corporation, Elkhart, IN (US)

(*) Notice: Subject to any disclaimer, the term of this patent is extended or adjusted under 35 U.S.C. 154(b) by 242 days.

(21) Appl. No.: 10/059,630

(22) Filed: Jan. 29, 2002

(65) Prior Publication Data

US 2003/0141488 A1 Jul. 31, 2003

(51) Int. Cl.⁷ .................................................. H01B 1/22
(52) U.S. Cl. ...................... 252/513; 252/514; 106/1.14; 106/1.18
(58) Field of Search ................................ 252/512, 514, 252/513; 106/1.18, 1.14

(56) References Cited

U.S. PATENT DOCUMENTS

| | | | | |
|---|---|---|---|---|
| 4,746,838 A | * | 5/1988 | Kay | 313/519 |
| 4,775,414 A | * | 10/1988 | Shoji | 75/247 |
| 4,806,159 A | * | 2/1989 | De Keyser et al. | 106/1.11 |
| 5,252,255 A | | 10/1993 | Moy et al. | |
| 5,336,444 A | | 8/1994 | Casey et al. | |
| 5,443,786 A | | 8/1995 | Yokoyama et al. | |
| 5,496,619 A | | 3/1996 | Itagaki et al. | |
| 5,652,042 A | | 7/1997 | Kawakita et al. | |
| 5,733,467 A | | 3/1998 | Kawakita et al. | |
| 5,914,358 A | | 6/1999 | Kawakita et al. | |
| 5,977,490 A | | 11/1999 | Kawakita et al. | |
| 6,080,336 A | | 6/2000 | Suehiro et al. | |
| 6,117,367 A | | 9/2000 | Bezama et al. | |
| 6,183,897 B1 | | 2/2001 | Hartvigsen et al. | |

* cited by examiner

Primary Examiner—Mark Kopec
(74) Attorney, Agent, or Firm—Mark P. Bourgeois

(57) ABSTRACT

A conductive composition for filling a via. The composition is based on total composition and has 4.0–12.0 wt. % organic vehicle and 88.0–96.0 wt. % electrically conductive particles selected from the group consisting of silver and nickel and mixtures thereof.

11 Claims, No Drawings

CONDUCTIVE VIA COMPOSITION

BACKGROUND OF THE INVENTION

1. Field of the Invention

This invention generally relates to conductive compositions. In particular, the invention is directed to compositions, which are suitable for making conductive vias in a ceramic substrate.

2. Description of the Related Art

Electrically conductive compositions have numerous applications. Thick film conductive compositions are screenable pastes, which are used to form conductive elements in electronic applications. Such compositions contain electrically conductive material dispersed in a screening agent.

Many electronic packages utilize a via to connect one level or layer of circuitry to another. A via is a hole or aperture that is filled with a conductive compound to provide an electrical connection between different planes of a package allowing one side to be electrically connected to another.

The via after processing needs to be very flat in order for subsequent processing steps to succeed. The ends of the via need to be flat and not have a protrusion or a depression. The via also needs to adhere to the side walls of the via hole and not pull away from it after processing.

Prior art via fill compositions have suffered from excessive shrinkage during processing that cause depressions to form in the end of the via. The prior art compositions also can cause the via fill material to pull away from the side wall of the via hole resulting in an open circuit.

Prior art via fill compositions use silver and gold as the metallic component of the via fill. Gold is too expensive for most applications and therefore has limited use. Silver is preferred. The problem with silver is that it sinters at very low temperatures. The more sintering that occurs, the more its volume decreases. Most via fills are fired at 850° C. which is close to silver's melting point of 960° C. and therefore undergo substantial sintering. This causes shrinking in the via fill during firing which can result in a depression on the surface and pulling away from the via side wall. Using materials that block such Rhodium can reduce the problem. Rhodium is expensive and does not completely block the sintering process. Non conductive materials such as alumina can be added to the silver to hinder sintering. When added in large quantities (replacing 60% of the silver) it does stop the sintering, however it also causes the electrical conductivity of the via fill to increase drastically. This high electrical resistance is detrimental to high frequency circuits.

A current unmet need exists for a conductive via composition that overcomes the deficiencies of the prior art compositions.

SUMMARY

The present invention is a conductive composition for filling a via. The composition is based on total composition and includes:

a) 4.0–12.0 wt. % organic vehicle; and
b) 88.0–96.0 wt. % electrically conductive particles selected from the group consisting of silver and nickel and mixtures thereof.

DETAILED DESCRIPTION

1. Organic Components

The organic component is common to the thick film industry and are commonly called screening agents. The screening agent wets the metal particles to form a paste that can be screened through a wire mesh pattern. The organic components used in the present invention comprises 4.0–12.0 wt. % of an organic vehicle or carrier based on total composition. One such organic vehicle contains 2.0–6.0 wt. % pine oil, 1.6–4.8 wt. % benzyl alcohol and 0.4–1.2 wt. % ethyl cellulose. Pine oil is commercially available from Chem Central Corporation. Benzyl alcohol is commercially available from Aldrich Chemical Corporation. Ethyl cellulose is commercially available from Hercules Corporation.

In the conductive via composition of the present invention, the organic vehicle is used in the range of 4.0–12.0 wt. % with a more preferred range of 7.0–10.0 wt. %. If less than 4.0 wt. % is used, the resulting conductive via composition is difficult to place into a hole or has poor hole filling properties. If more than 12.0 wt. % is used, the resulting via tends to have dimples on the ends of the via and pulls away from the via hole side wall. Other organic vehicles could also be used.

2. Conductive Component

The electrically conductive component of the present invention comprises fine spheroid shaped particles of electrically conductive materials such as silver, nickel, and mixtures thereof. A mixture of nickel and silver is the preferred conductive component. The conductive particles comprise 88.0 to 96.0 wt. % of the total composition with a preferred range of 90.0 to 93.0 wt. %.

The mixture of nickel and silver comprises 15.0 to 60.0 wt % silver and 28.0 to 81.0 wt % nickel of the total composition. A more preferred range of the nickel silver mixture is 15.0 to 30.0 wt. % silver and 66.0 to 78.0 wt. % nickel.

The preferred silver spheres are commercially available from Shoei Chemical Corporation as product number A-128. Silver spheres with a diameter in the range of 1.0–5.0 microns are used with a preferred size of 2.5 microns. The silver particles need to be spherical in order to promote flow into the via.

The preferred nickel spheres are commercially available from Atlantic Equipment Engineers as product number Ni-112. Nickel spheres with a diameter in the range of 15.0–25.0 microns are used with a preferred size of less than 20.0 microns. The nickel particles need to be spherical in order to promote flow into the via. Larger nickel spheres clog the mask or screen used to fill the via. Smaller nickel spheres have too much surface area for the silver to coat.

3. General Composition Preparation and Printing Procedures

In the preparation of the composition of the present invention, the electrically conductive metallic particles are mixed with the organic components. The organic vehicle, nickel spheres and silver spheres are placed in a three-roll mill and mixed for 20 minutes to form a paste. Moderate pressure is applied to the rolls. The resulting paste has a viscosity of 275 to 375 thousand centipoise.

Three-roll mill mixing is preferred for preparing the via fill composition. The via fill composition is placed in a bladder via fill machine manufactured by Pacific Trinetics Corporation. The bladder via fill machine has a mask with holes that correspond to the vias to be filled. A ceramic alumina substrate having holes to be filled is placed under the mask. The via fill composition is pressurized and extruded by the bladder fill machine through the mask and into the via. Screen printing can also be used to fill the vias. The vias are typically 8 mils in diameter and can range from 4 to 10 mils in diameter. The substrate is preferably 96% alumina and can range from 10 to 40 mils thick. Once the via is filled and fired it is no more than 25 microns above or below the top and bottom plain of the substrate.

The alumina substrate with filled vias is then cured in an oven at a temperature range of 80 degrees Celsius for 20 minutes. The substrate is then fired in an oven to sinter the via fill composition. The firing is done in an air atmosphere oven at 800 to 900 degrees Celsius for 5 to 30 minutes. Typical fired vias had a resistance of 0.05 ohm per via for a 8 mil diameter via that is 40 mils long.

4. Remarks

The nickel in the composition minimizes the sintering of the silver and also helps to maintains conductivity. The nickel does not sinter appreciably at the 850° C. firing temperature since its melting point is 1455° C. Also, as the silver tries to alloy with the nickel the majority of the silver nickel alloys also melt at a high temperature of approximately 1435° C. Nickel is also a fair conductor of electricity so its use as a partial replacement for silver does not significantly effect high frequency performance. The conductivities of several metals are given below:

| Metal | Conductivity (Microhm-Cm) |
| --- | --- |
| Silver | 1.59 |
| Copper | 1.67 |
| Gold | 2.35 |
| Nickel | 6.84 |
| Iron | 9.71 |
| Tin | 11.0 |
| Lead | 20.64 |

Changing the Nickel/Silver ratio has the following effect on the fired dimensions of the filled via. Starting with 100% Nickel the vias will conduct electricity and be very flat on the surface with little or no dimples. Note: dimples and protrusions are also effected by the organic vehicle percentage and will be discussed later. However after multiple firings, such as would be experienced to produce a thick film resistor circuit, the via will crack causing an open circuit and no longer conduct electricity. As silver is added to the composition, no improvement was observed until the silver ratio reaches about 15% of the total metal loading. At this point, the vias that were produced were still flat and continued to conduct electricity after the multiple firings. As even more silver is added, there was no change in the electrical performance after multiple firings but the vias begin to dimple. The dimples continue to get deeper until at around 60% silver loading, they are about one mil below the surface of the substrate. This is caused by the silver sintering as is found in the prior art.

The viscosity value of the resulting paste does not completely describe the flow properties of the invention. Actual via filling is required to fully evaluate the material. Slight adjustments are made in the organic percentage to adjust for dimples or protrusions in the filled via. The via fill of the invention is a slurry and behaves accordingly. As it becomes thick (high viscosity) it does not flow and therefore does not level on via filling and produces protrusions. Adding more organic reduces protrusions. As more organic is added the via fill material becomes thin (low viscosity) and flows after via filling to produce a flat surface. As more organic is added dimples begin to form. This is because the organic now makes up a substantial part of the via fill material and it is lost during firing as it evaporates. This changes the volume of the material in the filled via and causes it to shrink which produces the dimples on the surface.

5. Test Procedures

Side Wall Adhesion

The adhesion of the via fill composition within the hole was visually checked with a scanning electron microscope after cross-sectioning. Any air gaps between the via fill composition and the side wall of the hole would show loss of side wall adhesion. Pass criteria is no air gaps.

Mechanical Dimensions of Dimples and Protrusions

Mechanical dimensions of the fired vias were measured by a microscope. The maximum height of any protrusions and maximum depth of any dimples was measured.

EXAMPLES

The present invention will be described in further detail by giving practical examples. The scope of the present invention, however, is not limited in any way by these practical examples.

Example 1

This example describes the preparation of a via fill composition using nickel spheres with an average diameter of 20 microns and silver spheres with an average diameter of 5 microns. The components below were added to a 50-ml jar with mixing. The mixture was then roller milled in a three-roll mill for 20 minutes. Test results are shown in table 1.

| Component | Weight (%) |
| --- | --- |
| Pine oil | 2.9 |
| Benzyl alcohol | 2.8 |
| Ethyl cellulose | 0.6 |
| Silver spheres | 18.7 |
| Nickel spheres | 75.0 |

Example 2

This example describes the preparation of a via fill composition using nickel spheres with an average diameter of 20 microns and silver spheres with an average diameter of 5 microns. The components below were added to a 50-ml jar with mixing. The mixture was then roller milled in a three-roll mill for 20 minutes. Test results are shown in table 1.

| Component | Weight (%) |
| --- | --- |
| Pine oil | 3.2 |
| Benzyl alcohol | 3.1 |
| Ethyl cellulose | 0.6 |
| Silver spheres | 18.6 |
| Nickel spheres | 74.5 |

Example 3

This example describes the preparation of a via fill composition using nickel spheres with an average diameter of 20 microns and silver spheres with an average diameter of 5 microns. The components below were added to a 50-ml jar with mixing. The mixture was then roller milled in a three-roll mill for 20 minutes. Test results are shown in table 1.

| Component | Weight (%) |
|---|---|
| Pine oil | 3.7 |
| Benzyl alcohol | 3.5 |
| Ethyl cellulose | 0.7 |
| Silver spheres | 18.4 |
| Nickel spheres | 73.7 |

TABLE 1

| Properties | Example 1 | Example 2 | Example 3 |
|---|---|---|---|
| Side Wall Adhesion | Pass | Pass | Pass |
| Dimples (microns) | 0 | 5 | 25 |
| Protrusions (microns) | 50 | 20 | 0 |

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A conductive composition for filling a via, based on total composition comprising:
   a) 4.0–12.0 wt. % organic vehicle;
   b) 15.0–30.0 wt. % silver particles; and
   c) 66.0–78.0 wt. % nickel particles.

2. The conductive composition according to claim 1, wherein the organic vehicle based on total composition comprises:
   a) 2.0–6.0 wt. % pine oil;
   b) 1.6–4.8 wt. % benzyl alcohol; and
   c) 0.4–1.2 wt. % ethyl cellulose.

3. The conductive composition according to claim 1, wherein the nickel and silver particles have a spherical shape.

4. The conductive composition according to claim 3, wherein the nickel particles have a diameter of 15.0–25.0 microns.

5. The conductive composition according to claim 3, wherein the silver particles have a diameter of 1.0–5.0 microns.

6. The conductive composition according to claim 1, wherein the conductive composition is applied to a substrate that is chosen from the group consisting of alumina ceramic and aluminum nitride.

7. The conductive composition according to claim 6, wherein the conductive composition is cured at a temperature range from 800 degrees Celsius to 900 degrees Celsius.

8. The conductive composition according to claim 7, wherein the conductive composition has a cure time between 5 and 30 minutes.

9. A conductive composition for providing an electrically conductive via, the composition based on total composition comprising:
   a) 2.0–6.0 wt. % pine oil;
   b) 1.6–4.8 wt. % benzyl alcohol;
   c) 0.4–1.2 wt. % ethyl cellulose;
   d) 15.0–30.0 wt. % silver particles; and
   e) 66.0–78.0 wt. % nickel particles.

10. An electronic package comprising:

a ceramic substrate having a top and bottom surface and at least one hole extending through the substrate between the top and bottom surfaces;

a conductive composition located in the hole, the conductive composition filling the hole without dimples or protrusions, the conductive composition comprising;
      4.0–12.0 wt. % organic vehicle;
      15.0–30.0 wt. % silver particles; and
      66.0–78.0 wt. % nickel particles.

11. The electronic package according to claim 10, wherein the organic vehicle based on total composition comprises:
   2.0–6.0 wt. % pine oil;
   1.6–4.8 wt. % benzyl alcohol; and
   0.4–1.2 wt. % ethyl cellulose.

* * * * *